US006741349B1

(12) United States Patent
Sweatt et al.

(10) Patent No.: US 6,741,349 B1
(45) Date of Patent: May 25, 2004

(54) OPTICAL MICROSPECTROMETER

(75) Inventors: William C. Sweatt, Albuquerque, NM (US); Todd R. Christenson, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 10/175,211

(22) Filed: Jun. 18, 2002

Related U.S. Application Data

(63) Continuation-in-part of application No. 09/742,778, filed on Dec. 20, 2000, now Pat. No. 6,589,716.

(51) Int. Cl.[7] ................................................. G01J 3/28
(52) U.S. Cl. ....................................................... 356/328
(58) Field of Search .................................. 356/326, 328

(56) References Cited

U.S. PATENT DOCUMENTS

| | | | |
|---|---|---|---|
| 5,652,681 A | * 7/1997 | Chen et al. .................. | 356/328 |
| 6,249,346 B1 | * 6/2001 | Chen et al. .................. | 356/328 |
| 6,496,616 B2 | * 12/2002 | Frish et al. ................... | 385/24 |

OTHER PUBLICATIONS

Anderer, et al., "Development of a 10–Channel Wavelength Division Multiplex/Demultiplexer Fabricated by An X–Ray Micromachining Process," *Proc. SPIE Micro–Optics 1014*, 17 (1988).
Mohr, et al., "Fabrication of a Planar Grating Spectrograph by Deep–etch Lithography with Synchrotron Radiation," *Sensors and Actuators A 27*, 571 (1991).

Staerk, et al., "Design considerations and performance of a spectro–streak apparatus applying a planar LIGA microspectrometer for time–resolved ultrafast fluorescence spectroscopy," *Rev. Sci. Instrum. 67(7)*, 2490 (1996).

Capron, et al., "Design and Performance of a Multiple Element Slab Waveguide Spectrograph for Multimode Fiber–Optic WDM Systems," *J. Lightw. Technol. 11(12)*, 2009 (1993).

Sander, et al., "Microspectrometer with slab–waveguide transmission gratings," *Appl. Optics 35(21)*, 4096 (1996).

Sander, et al., "Selffocussing phase transmission grating for an integrated optical microspectrometer," *Sensors and Actuators A 88*, 1 (2001).

Steag microParts, "Optical Devices: Microspectrometers," [retrieved on Jun. 13, 2002]. Retrieved from the Internet:<URL:http://www.microparts.de/english/optics.html.

* cited by examiner

*Primary Examiner*—F. L. Evans
(74) *Attorney, Agent, or Firm*—Kevin W. Bieg

(57) ABSTRACT

An optical microspectrometer comprises a grism to disperse the spectra in a line object. A single optical microspectrometer can be used to sequentially scan a planar object, such as a dye-tagged microchip. Because the optical microspectrometer is very compact, multiple optical microspectrometers can be arrayed to provide simultaneous readout across the width of the planar object The optical microspectrometer can be fabricated with lithographic process, such as deep X-ray lithography (DXRL), with as few as two perpendicular exposures.

13 Claims, 6 Drawing Sheets

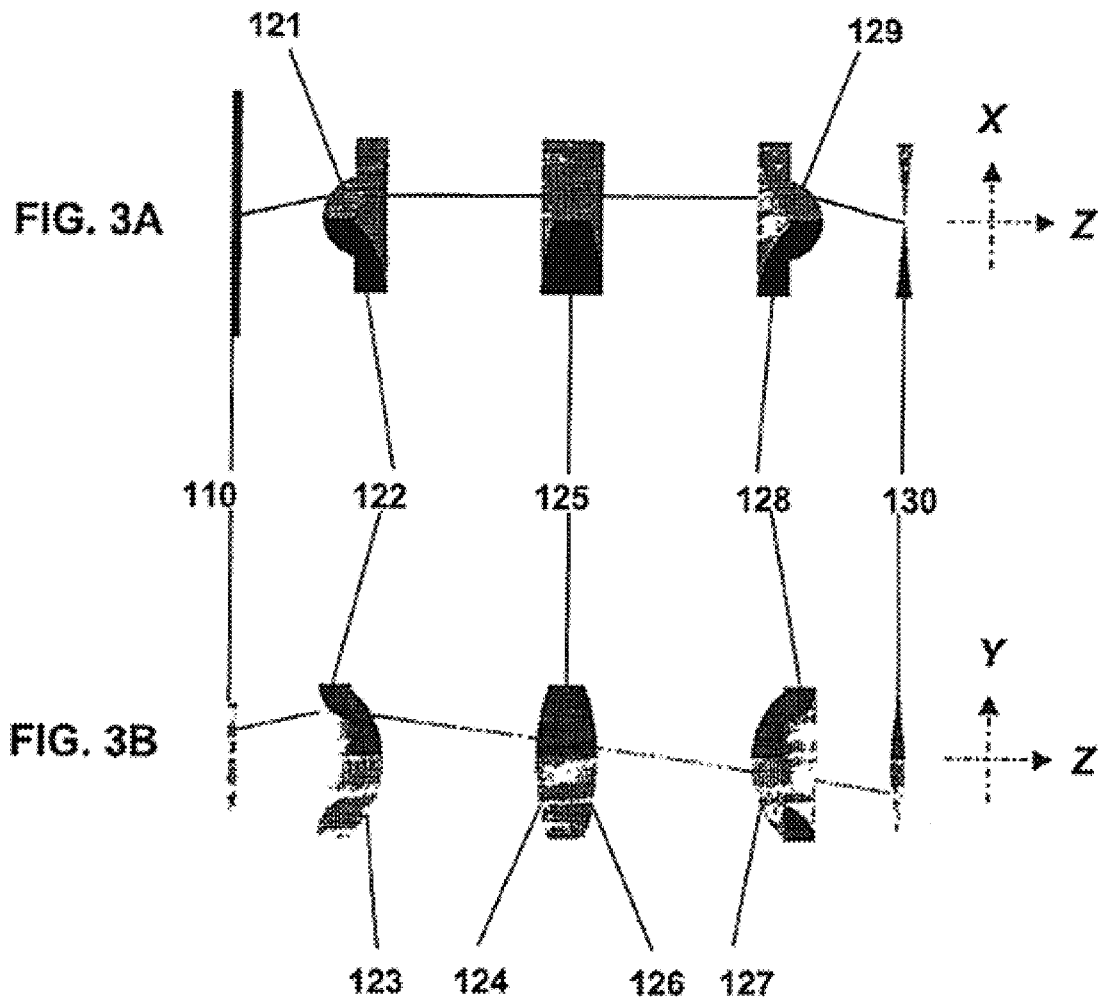

OPTICAL MICROSPECTROMETER

This application is a continuation-in-part of patent application Ser. No. 09/742778, filed on Dec. 20, 2000, now U.S. Pat. No. 6,589,716 which is incorporated herein by reference.

STATEMENT OF GOVERNMENT INTEREST

This invention was made with Government support under contract no. DE-AC04-94AL85000 awarded by the U. S. Department of Energy to Sandia Corporation. The Government has certain rights in the invention.

FIELD OF THE INVENTION

The present invention relates to optical spectrometers and, in particular, to an imaging optical microspectrometer that uses a grism as the dispersive element and is fabricated lithographically.

BACKGROUND OF THE INVENTION

With the advent of portable, miniature integrated optical systems, there has been an increasing need for microspectrometers that can provide spectral analysis at optical wavelengths. Such microspectrometers have a wide range of potential spectrophotometric applications, including medical diagnostics, wavelength division multiplexing (WDM), and environmental and process analysis.

A particular application of growing importance is for the spectrophotometric analysis of genomic and proteomic microarrays, also termed "DNA chips" or "microchips". These microchips are used extensively to assess the composition of genetic material in a tissue sample for drug discovery research and are likely also to find application in genetic profiling, medical diagnostics and therapy, and the detection of biowarfare and bioterrorism agents. A typical microchip comprises a checkerboard array of perhaps tens of thousands of different DNA molecules, or probes, tethered to a wafer that can be the size of a microscope slide. Genetic material that carries a fluorescent tag, or label, selectively reacts with the DNA molecules on the microchip. The fluorescence from the dye-tagged microchip can then be scanned to provide a color-coded readout of the microarray to determine gene activity.

A planar grating microspectrometer has been developed, primarily for WDM applications. Anderer et al. "Development of a 10-channel wavelength division multiplexer/demultiplexer fabricated by an X-ray micromachining process" SPIE 1014, 17 (1988). A later version of this planar grating microspectrometer is marketed by Steag microParts. See "Optical Devices: Microspectrometers,"[retrieved on May 9, 2002]. Retrieved from the Internet:<URL:http://www.microparts.de/english/optics. html>. The commercial microspectrometer comprises a monolithic dielectric slab waveguide with an integrated focusing echelette grating formed on the convex edge of the waveguide by a micromolding technique. Light is injected into the waveguide, dispersed by the grating, and focused into ten output optical fibers. The microspectrometer has a spectral range of 380 nm–780 nm and a numerical aperture of about 0.2 with a 50/125 µm optical input fiber. The microspectrometer itself has a footprint of about 29×14 mm$^2$. Another microspectrometer uses a planar waveguide with a selffocussing phase transmission grating in a compact rectangular design with a footprint of 11×11 mm$^2$. Sander et al., "Selffocussing phase transmission grating for an integrated optical microspectrometer", *Sensors and Actuators* A88, 1 (2001).

Neither of these planar microspectrometers is suitable for two-dimensional imaging of a planar object. Also, these planar microspectrometers have a relatively large footprint and cannot easily be fabricated into a microspectrometer array.

The optical microspectrometer of the present invention can spectrally image a line object. A single optical microspectrometer can be used to sequentially scan a planar object, such as a dye-tagged microchip. Because the optical microspectrometer is very compact, multiple optical microspectrometers can be arrayed to provide simultaneous readout of the planar object. The optical microspectrometer can be used to identify dye tags and for coarse WDM. The present invention uses a lithographic process, such as deep X-ray lithography (DXRL), to provide for the monolithic fabrication of the pre-aligned microoptical elements of the optical microspectrometer on a common substrate.

SUMMARY OF THE INVENTION

An optical microspectrometer for spectral imaging of light from an object comprises a substrate having a surface with a plurality of microoptical elements monolithically formed thereon and aligned on an optical axis, the microoptical elements comprising a slit through which the light from the object passes, a collimating lens to collimate the light from the slit, a grism to disperse the collimated light from the collimating lens, and an imaging lens to focus the dispersed light from the grism and provide a spectrally resolved image of the slit on a detector. The microoptical elements can further comprise a collecting lens to collect light from the object and a focusing lens to focus the collected light from the collecting lens onto the slit.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 3 shows orthogonal views of the foreoptics section of the optical microspectrometer. FIG. 3A is a view of the foreoptics section looking down the Y axis. FIG. 3B is a view of the foreoptics section looking up the X axis.

FIG. 4 shows orthogonal views of the spectrometer section of the optical microspectrometer.

DETAILED DESCRIPTION OF THE INVENTION

The present invention is directed to an optical microspectrometer wherein the microoptical elements are fabricated lithographically and pre-aligned on an optical axis on a common substrate. The compact optical microspectrometer comprises a built-in slit and a spectrometer section that uses a grism as the dispersing element. The grism, which is a combination of a grating and a prism, enables in-line viewing for the central wavelength for direct spectroscopy. The spectrometer section can image the slit or an object that is butted up against the slit, such as an optical fiber or linear array of fibers, onto a detector after the wavelengths are dispersed by the grism. The optical microspectrometer can further comprise a foreoptics section to focus an object, such as a microscope slide, onto the slit. All of the optical surfaces of the microoptical elements can be obtained with only two orthogonal lithographic exposures.

Figure 1:
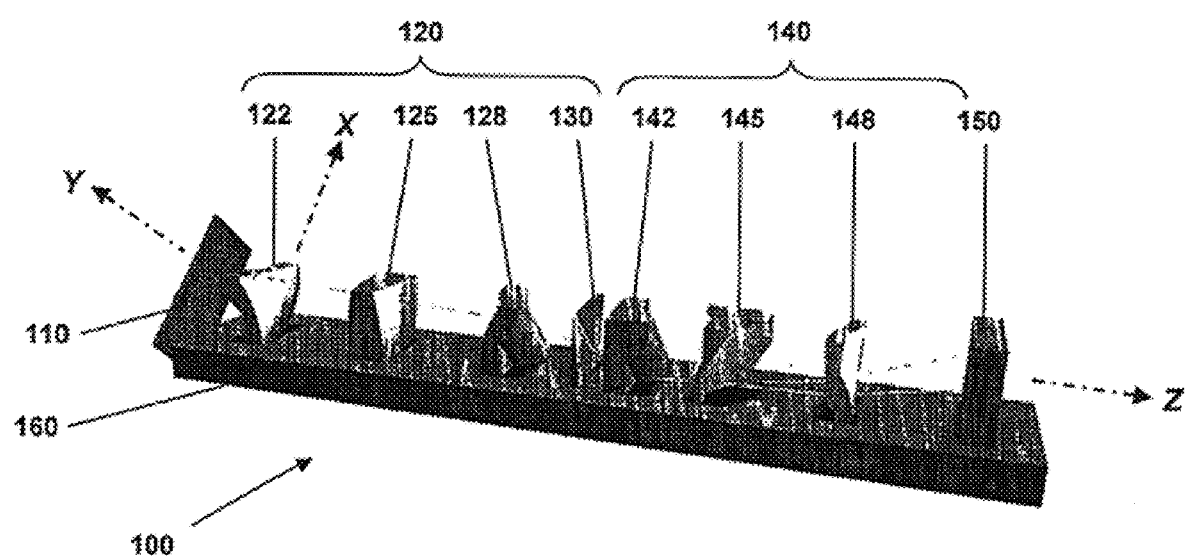
FIG. 1 is a perspective view of the optical microspectrometer.

FIG. 1 shows a perspective view of an optical microspectrometer 100 that can be used for the scanning of an object 110. For scanning, the optical microspectrometer 100 can have a foreoptics section 120, comprising collecting lens 122, middle lens 125, and focusing lens 128; a slit 130; and a spectrometer section 140, comprising collimating lens 142, grism 145, and imaging lens 148. The dispersed wavelengths from the grism 145 can be focused onto a detector 150 to provide a spectrally resolved image of the slit 130. The detector 150 can be a two-dimensional imaging detector, such as a charge coupled device (CCD). Alternatively, an optical signal-carrying fiber or linear array of fibers can be butted up against the slit 130 directly, eliminating the need for the foreoptics section 120. The optical microspectrometer 100 can scan in the X direction a line of the object 110 that is parallel to the Y direction and the slit 130. The microoptical elements can be monolithically formed on the surface of substrate 160 to be pre-aligned along an optical axis Z.

Conventional optical systems are comprised of optical elements. An example of such an optical element is a simple lens. A simple lens consists of a body of an optical material (e.g., glass or polymer), comprising two refractive surfaces. Generally, the refractive surfaces of the simple lens are spherical segments that are radially symmetric about a common optical axis.

However, making simple lenses with optical axes substantially parallel to a surface using lithographic or other microfabrication techniques is very difficult. Lithographic patterning best defines structures which are projected two-dimensional figures, so that a complex series of lithographic processes is typically required to code a latent profile in the photoresist that, when developed, will produce the desired, three-dimensional spherical surfaces. Fortunately, the optical function of a simple spherical lens can be closely approximated by an optical element having two cylindrical refracting surfaces, the cylindrical axes of which are normal to the desired optical axis, and which are oriented so that the cylindrical axes are mutually perpendicular.

Figure 2:
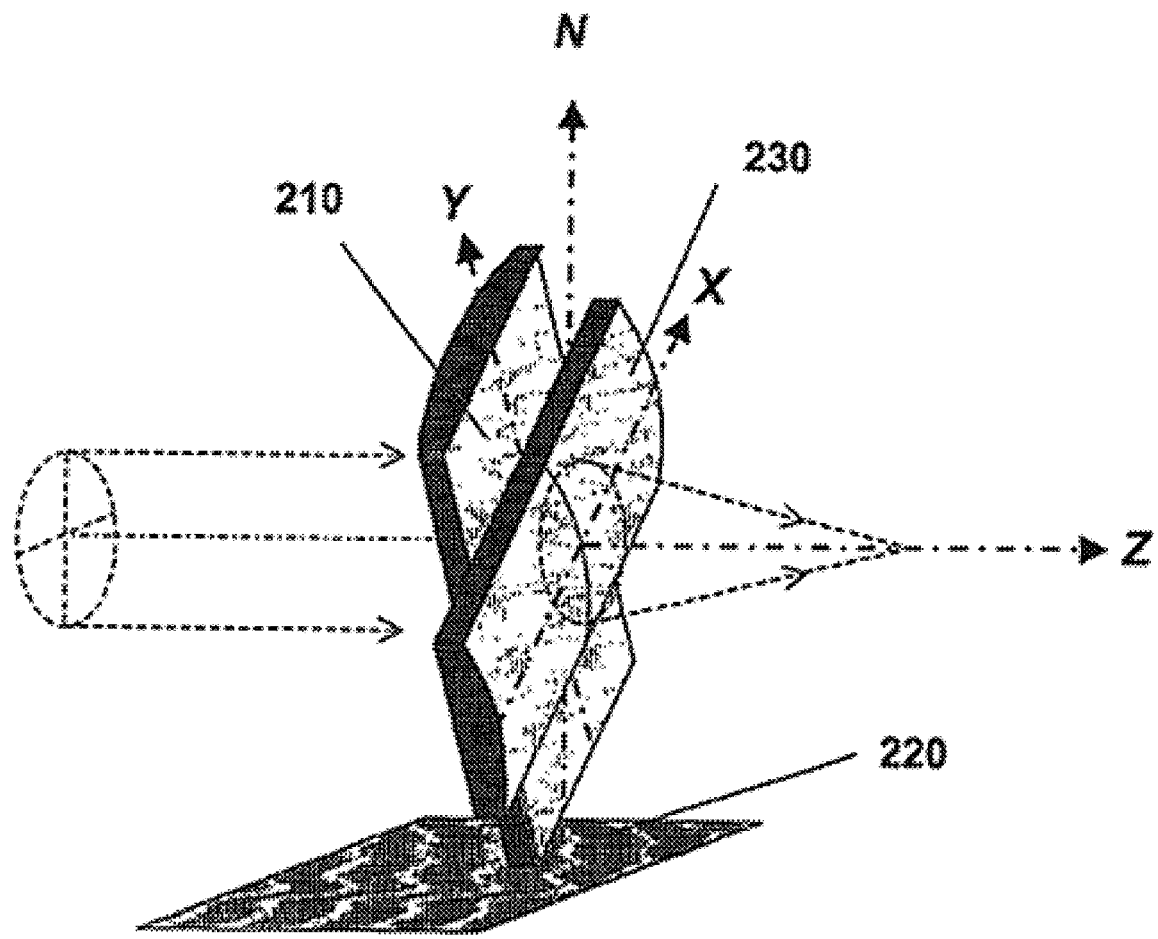
FIG. 2 is an illustration of two crossed convex planocylindrical lenses.

FIG. 2 shows two opposing convex plano-cylindrical lenses 210, 230 oriented with their cylindrical axes X, Y perpendicular to one-another and to the optical axis Z, yielding a positive simple lens. The two cylindrical axes X, Y are tilted at +45° and −45° relative to the substrate surface normal N. The optical axis Z of the cylindrical lenses 210, 230 is substantially parallel to the surface 220.

The microoptical lens elements of the optical microspectrometer 100 can comprise crossed-cylindrical optical surfaces oriented in orthogonal X and Y directions by the lithographic process. The slit 130 and the grating surface of the grism 145 can be formed by the same lithographic process.

Variations of the basic optical microspectrometer 100 for imaging UV/visible/NIR radiation can be designed with a modem optical design code for specific applications. As an example, described below is an optical microspectrometer 100 designed with such an optical design code that can spectrally image a 0.2 mm line object using polymethylmethacrylate (PMMA) as the optical material. The overall length of the exemplary optical microspectrometer 100 can be about 4 mm, with a clear aperture of about 0.4 mm. The optical microspectrometer 100 may be suitable for scanning a microchip.

Foreoptics Section

FIG. 3A is a view of the foreoptics section 120 of the exemplary optical microspectrometer 100 looking down the Y axis. FIG. 3B is a view of the foreoptics section 120 looking up the X axis. The foreoptics section 120 can preferably be a symmetric three-element lens system, comprising collecting lens 122, middle lens 125, and focusing lens 128. The foreoptics section 120 should preferably focus a line object 110 onto the slit 130 for the range of colors desired. Good image quality for ray fans perpendicular to the slit 130 (i.e., in the X-Z plane) can be obtained with two cylindrical surfaces 121, 129 with cylindrical axis in the Y direction, as shown in FIG. 3A. Preferably, more than two cylindrical surfaces 123, 127 can be used to form the image along the slit 130 (i.e., in the Y-Z plane). Therefore, the middle lens 125 can be added to provide two additional cylindrical surfaces 124, 126 with cylindrical axes in the X direction, as shown in FIG. 3B.

The collecting lens 122 can comprise two opposing crossed convex surfaces 121, 123. The front surface 121 of the collecting lens 122 can be a positive cylindrical surface having a cylindrical axis in the Y direction, parallel to the line object 110. The collecting lens 122 can further have a positive cylindrical back surface 123 having a cylindrical axis in the X direction, perpendicular to the line object 110. The collecting lens 122 thereby produces a collimated rectangular or round beam. The focusing lens 128 can be an opposing, matched lens, with a positive cylindrical back surface 129 having a cylindrical axis in the Y direction to focus the collimated beam onto the slit 130 in the X-Z plane. The beam is focused in the Y-Z plane by the positive front surface 127 of focusing lens 128 to produce an inverted image of the line object 110 at the slit 130. The middle lens 125 can be a symmetric bi-convex lens, with front and back positive cylindrical surfaces 124, 126 having cylindrical axes in the X direction, to provide additional correction of the beam in the Y-Z plane. Alternative optical designs are possible for the foreoptics section 120. Since the cylindrical surfaces are cut lithographically, higher order terms can be added to further the basic cylindrical shape to correct for monochromatic aberrations. Additionally, different material combinations can be used to reduce chromatic aberrations of the lenses.

The foreoptics section 120 of the exemplary optical microspectrometer 100 of the present invention has a clear aperture of about 0.4 mm and an overall length of about 2.45 mm. The cylindrical front surface 121 of the collecting lens 122 and the cylindrical back surface 129 of the focusing lens 128 have radii of curvature about Y axes of about 0.15 mm. The distance along the optical axis Z between the front surface 121 of collecting lens 122 and the line object 110 is about 0.3 mm. Similarly, the axial distance from the back surface 129 of focusing lens 128 and the slit is 0.3 mm. The crossed-cylindrical back surface 123 of the collecting lens 122 and the crossed-cylindrical front surface 127 of the focusing lens 128 have radii of curvature about X axes of about 0.37 mm. The thicknesses of collecting lens 122 and focusing lens 128 are about 0.24 mm. The middle lens 125 has front and back cylindrical surfaces 124, 126 with radii of curvature about X axes of about 0.89 mm. The axial distances from the rear surface 123 of collecting lens 122 to the front surface 124 of the middle lens and from the rear surface 126 of the middle lens 125 to the front surface of the focusing lens 128 are about 0.57 mm. The thickness of middle lens 125 is about 0.23 mm. Residual aberrations can be corrected and the image quality improved if the curved refractive surfaces deviate slightly from the basic cylindrical profile.

With conjugate optics, the light gathering power of the exemplary foreoptics section 120 is determined by the numerical aperture of the collecting lens 122. The numerical aperture of the collected light is about 0.3. The line object 110 is relayed with unit magnification to the slit 130. The RMS blur diameter of the foreoptics section 120 is about 5 $\mu$m, averaged over the length of the slit and the whole wavelength band.

The length of the slit 130 can preferably be half of the aperture diameter, or about 200 $\mu$m. The slit width can be chosen by the user for the desired application. A narrower slit 130 will give better imaging resolution and better spectral resolution. However, a narrower slit 130 will also reduce the optical throughput and the signal level at the detector. A reasonable trade-off for the width of the slit 130 is about 10-$\mu$m.

Spectrometer Section

Figure 4A:
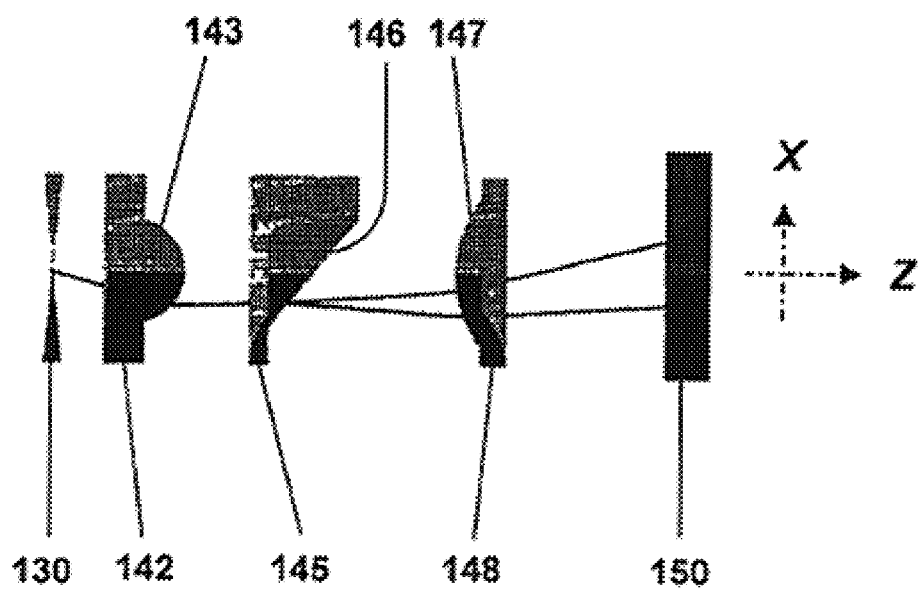
FIG. 4A is a view of the spectrometer section looking down the Y axis.
Figure 4B:
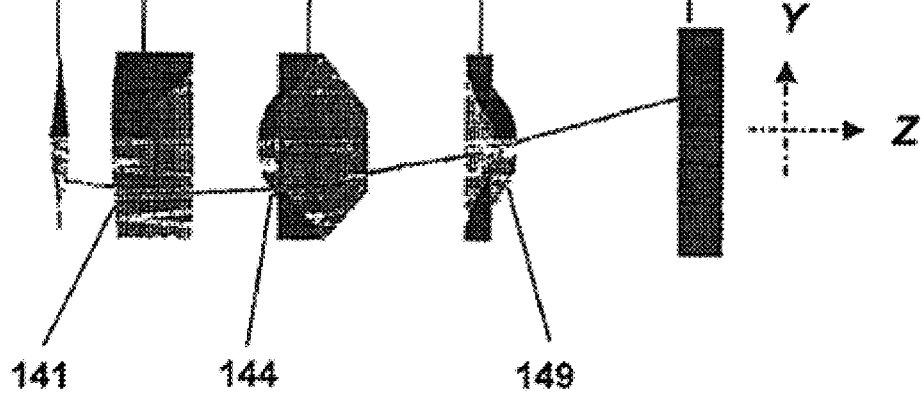
FIG. 4B is a view of the spectrometer section looking up the X axis.

FIG. 4A is a view of the spectrometer section 140 of the exemplary optical microspectrometer 100 looking down the Y axis. FIG. 4B is a cross-sectional view of the spectrometer section 140 looking up the X axis. The spectrometer section 140 preferably comprises collimating lens 142, grism 145, and imaging lens 148.

A grism is a light dispersing optical element comprising a prism having a transmission grating replicated on a refractive surface of the prism. Grisms can disperse light of the central wavelength in a path parallel to the input optical axis. The dispersion is primarily due to the grating, with the prism bending the deflected light back to provide net zero deviation at the central wavelength. This property is particularly useful for the optical microspectrometer 100 of the present invention, as it enables a compact, in-line design whereby the optical surfaces can be formed with only two orthogonal lithographic exposures.

Figure 5:
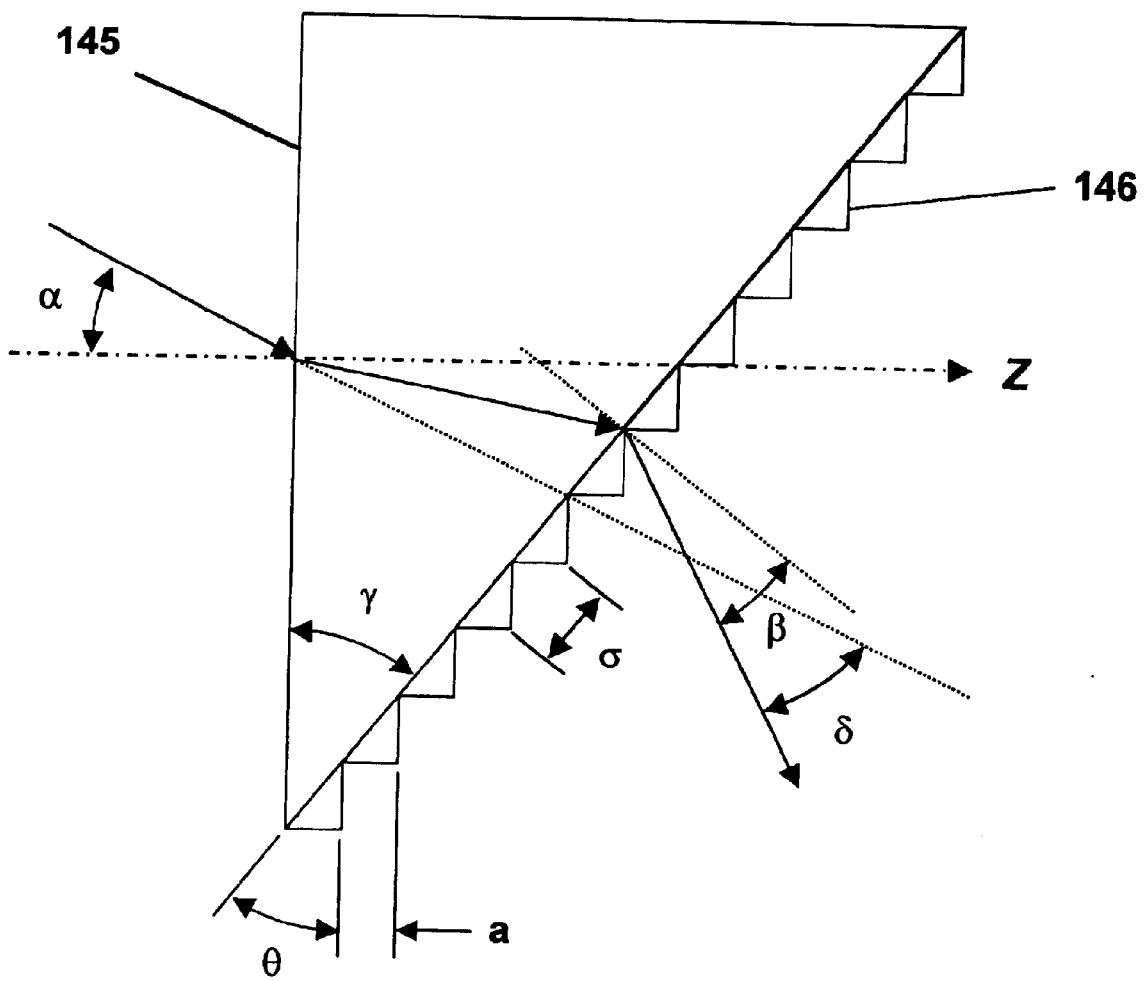
FIG. 5 shows the grism geometry.

FIG. 5 shows the ray geometry of a simple homogenous grism 145 wherein the planar diffraction grating is made of the same material as the prism. Using Snell's law and the grating equation, the grism equation is given by $$m\lambda/\sigma = n\sin[\gamma - \arcsin(\sin(\alpha)/n)] + \sin(\beta)$$

where m is the diffraction order, $\lambda$ is the wavelength, $\sigma$ is the groove spacing, n is the refractive index of the grism material, $\gamma$ is the grism apex angle, $\alpha$ is the incident angle, and $\beta$ is the exit angle.

The angular deviation $\delta$ is given by $$\delta = \beta - \alpha + \gamma$$

Therefore, for an undeviated beam ($\delta = 0°$) the grism equation becomes $$m\lambda/\sigma = n\sin[\beta - \arcsin(\sin(\alpha)/n)] - \sin(\gamma - \alpha)$$

A reasonably efficient grating can be achieved with a classical step geometry wherein the faces of the grating facets are approximately perpendicular to the transmitted light beam, to minimize refraction angles and associated Fresnel losses, and the steps are parallel to the transmitted beam, to minimize shadowing by adjacent facets. For a right angle grism 145 having the transmission grating replicated on its back surface 146 and an undeviated beam (i.e. $\alpha = \delta = 0°$) propagating along the optical axis in the Z direction, the blaze angle $\theta$ can therefore be equal to the grism apex angle. For maximum transmitted intensity, the pathlength difference between adjacent optical paths should be an integral number of wavelengths. For a transmitted beam perpendicular to the face of the grating facet, the phase-matching condition is then given by $$m\lambda = a(n - n_{air})$$

where a is the facet step height. For example, for PMMA (n~1.48) and m=1, the facet step height is preferably a=1.74 $\mu$m at a center wavelength $\lambda_c = 0.85$ $\mu$m.

A grism has the additional advantage of a more uniform angular dispersion than either a prism or diffraction grating alone, due to the counteracting dispersion nonlinearities of the prism, which is more dispersive at short wavelengths, and the grating, which is more dispersive at long wavelengths. Therefore, the grism 145 can provide adequate color separation over the field of view of the detector 150. For example, for a grism 145 having an undeviated center wavelength of $\lambda_c = 0.85$ $\mu$m and a grism apex angle of $\gamma = 40°$ (i.e., a groove spacing of $\sigma = 2.7$ $\mu$m), the fan of centerlines is about 12° (i.e., $\delta = +6°$ at $\lambda = 1.05$ $\mu$m and $\delta = -6°$ at =0.65 m).

The theoretical diffraction-limited spectral resolution for a grism with an undeviated beam is given by $$\lambda/\Delta\lambda = \tan(\gamma)(n-1)d/1.22\lambda$$

where d is the diameter of the collimated, normally incident beam. For the right angle grism 145 described above and a 0.4 mm diameter collimated beam at a center wavelength of $\lambda_c = 0.85$ $\mu$m, the spectral resolution is about 190. Thus, the smallest resolvable wavelength difference of a defraction-limited grism 145 is about 5 nm at the center wavelength.

Alternative blaze geometries can be designed to provide high grating efficiencies and to correct for chromatic aberrations. For example, the phase introduced by the grating is comprised of a linear term plus a small quadratic term. The linear term does essentially all of the dispersion of the wavelengths. The small quadratic term provides correction of axial chromatic aberration due to variation in the focal length with change in wavelength perpendicular to the slit. The grating frequency (lines/mm) can increase monotonically (i.e., the groove spacing decreases) away from the apex of the grism, so the quadratic term can act like a positive lens. Thus, for the grism 145 described above, the grating can have a spatial frequency of 368.4 lines/mm at the center of the aperture and a frequency of 368.4 +/−5.40 lines/mm at a +/−0.25-mm distance measured along the surface 146 of the grism 145.

The back surface 143 of the collimating lens 142 can be a positive cylindrical surface with a cylindrical axis in the Y direction, parallel to the slit 130, to collimate the light emerging from the slit 130 in the X-Z plane. The front positive cylindrical surface 141 of the collimating lens 142 and the front positive cylindrical surface 144 of the grism 145 can have cylindrical axes perpendicular to the slit (i.e., in the X direction) to collimate the light in the Y-Z plane. The positive cylindrical back surface 149 of the imaging lines 148 produces an inverted image of the slit 130 (i.e., an erect image of the line object 110) at the detector 150. The positive cylindrical front surface 147 of imaging lens 148 refocuses the dispersed light from the grism 145 to produce a spectrally resolved image of the slit 130 on the detector 150. The aperture of the imaging lens 148 can be slightly larger than the aperture of the collimating lens 142 to avoid vignetting of the dispersed beam from the grism 146.

The spectrometer section 140 of the exemplary optical microspectrometer 100 of the present invention has a clear aperture of about 0.4 mm and an overall length of about 1.9 mm. The cylindrical front surface 141 of the collimating lens 142 has a radius of curvature about an X axis of about 2.52 mm. The distance along the optical axis Z from the slit 130 to the front surface 141 of the collimating lens 142 is about 0.16 mm. The cylindrical back surface 143 of the collimating lens 142 has a radius of curvature about a Y axis of about 0.16 mm. The thickness of collimating lens 142 is about 0.25 mm. The cylindrical front surface 144 of the grism 145 has a radius of curvature about an X axis of about 0.25 mm. The axial distance from the rear surface 143 of the collimating lens 142 to the front surface 144 of the grism 145 is about 0.20 mm. The grism 145 has an axial thickness of about 0.2 mm for the undeviated beam. The cylindrical front surface 147 of imaging lens 148 has a radius of curvature of about 0.36 mm about a Y axis and the cylindrical rear surface 149 has a radius of curvature of about 0.25 mm about a X axis. The distance from the rear grating surface 146 of the grism 145 to the front surface of the imaging lens 147 is about 0.44 mm. The thickness of the imaging lens 148 is about 0.16 mm and the distance from its rear surface 149 to the detector 150 is about 0.49 mm. Again, residual aberrations can be corrected and the image quality improved if the curved refractive surfaces deviate slightly from the basic cylindrical profile.

The magnification of the spectrometer section 140 is 1:1.33. The spectrometer section 140 can image the spectrally dispersed light from the right angle grism 145 described above onto a CCD detector 150 that is 125 $\mu$m across (i.e., in the X direction) and 270 $\mu$m high (i.e., in the Y direction). For a slit width of 10 $\mu$m, the angular blur for the optical microspectrometer 100 is about 12 $\mu$m. Therefore, the detector 150 can resolve about ten color bins over its field of view.

Fabrication of the Optical Microspectrometer

The optical microspectrometer 100 can be fabricated lithographically. The optical microspectrometer 100 can be fabricated from a layer of photoresist applied to the surface of a substrate using a lithographic process. The photoresist layer can be patterned, typically using a collimated beam of X-rays in a DXRL process, in a manner that codes latent profiles therein. DXRL can produce very steep (i.e., well collimated) radiation and photoresist profiles. The unwanted portions of the photoresist layer can then be removed, thereby producing a plurality of microoptical elements, such as lenses, grisms, and slits, that are integral to the substrate.

Crossed-cylindrical lenses, of the type shown in FIG. 2 and suitable for the optical microspectrometer 100 of the present invention, can be fabricated using lithographic processes. The desired optical elements require fabrication of paired cylindrical surfaces which have accurate and properly aligned cylindrical shapes, the features thereof having a degree of smoothness suited to optical applications. One class of such lithographic processes uses a collimated beam of radiation to code latent profiles in a photoresist layer applied to a substrate surface. The photoresist, the radiation, and the operating procedure used are chosen so that the absorption length of the radiation in the photoresist allows the desired thickness of the photoresist layer to acquire the required exposure in correspondence with a patterning mask, and also so that lateral spread of the radiation within the photoresist does not distort the desired shape of the latent profiles.

Lithographic processes which are suitable in some circumstances for the fabrication of the crossed-cylindrical lenses, and other optical components of the present invention, include ultraviolet (greater than 350 nanometers wavelength), deep ultraviolet (150 to 300 nanometers wavelength), and deep X-ray lithography (DXRL, less than 150 nanometers wavelength). DXRL is particularly well suited for fabricating the microoptical elements, being able to rapidly and cost effectively form photoresist optical structures having structural heights in excess of one millimeter, RMS optical surface smoothness better than 10 nanometers, and dimensional tolerances which can be less than 0.1 micron. This surface roughness will produce diffuse scattering of about 1% of the incident light. The light loss due to specular reflection will be about 4% per surface. Specular reflection losses can be reduced by application of suitable anti-reflection coatings to the optical surfaces.

DXRL works by applying a highly collimated beam of high energy X-rays through a patterning mask to a thick layer of X-ray sensitive photoresist. The X-ray beam is typically generated using a synchrotron, but this is not essential to the practice of the present invention. Directing the X-ray beam along a direction which is not parallel to the surface normal of the substrate surface enables the exposure of latent profiles having nonvertical sidewalls.

Suitable photoresist materials include polymethylmethacrylate (PMMA), epoxy-based, and polyamide-based photoresists. PMMA is a positive resist that has optical properties similar to those of the standard crown glass, BK7. However, PMMA is a fairly insensitive photoresist and requires fairly long exposures to pattern the microoptical elements. A new negative photoresist of interest is the epoxy-based SU-8 (and related family members). These resists are roughly 100 times faster than PMMA, so the exposure times can be reduced to less than half a minute. SU-8 is similar in optical properties to a flint glass. Both the index of refraction (n~1.65) and the dispersion of SU-8 are higher than those of PMMA. The higher index can enable faster optics, better light collection, and better spectral resolution. However, the higher index will give larger Fresnel losses. Fresnel losses can be reduced by applying an anti-reflection coating to the optical surfaces, for example, by a vacuum deposition or sol-gel process.

Figure 6:
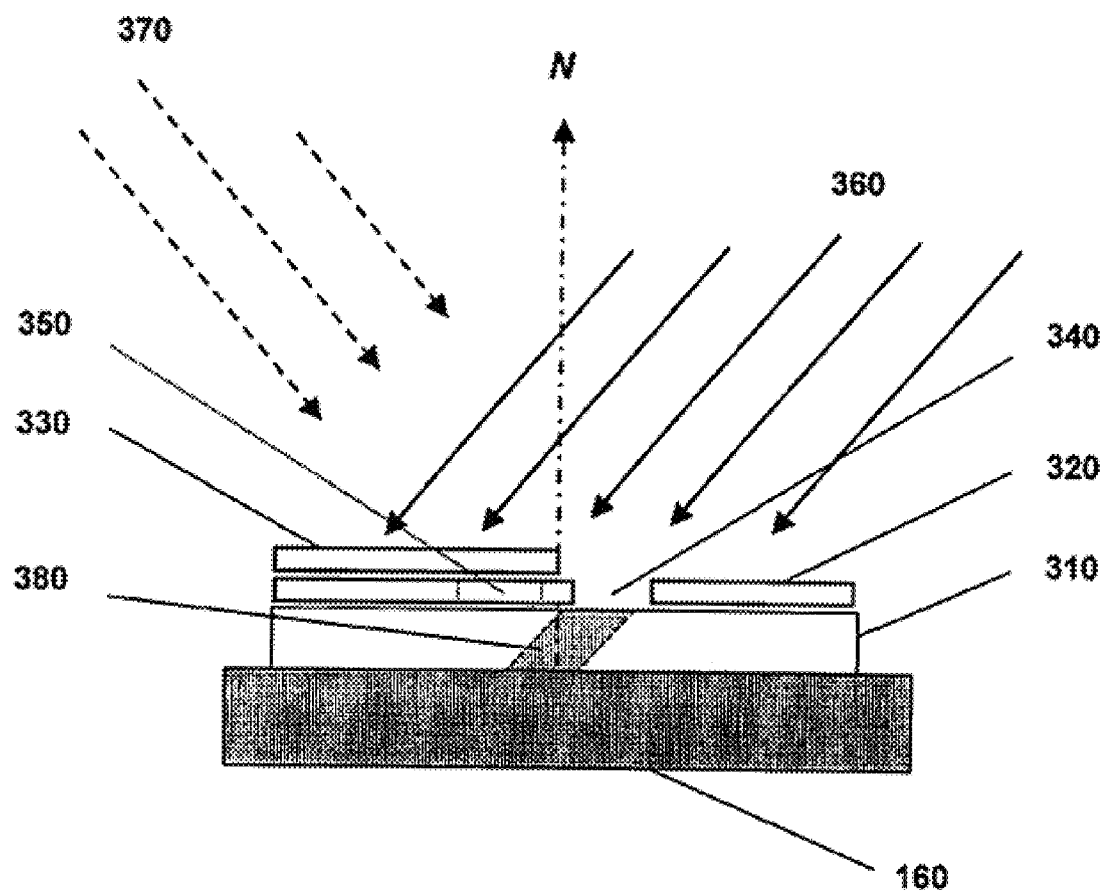
FIG. 6 is an illustration of the exposure geometry in a photoresist material to make crossed cylindrical surfaces by a DXRL process.

FIG. 6 illustrates the exposure geometry to produce a crossed-cylindrical lens. A layer of photoresist 310 can be coated on a surface of the substrate 160. The thickness of the photoresist layer 310 defines the maximum vertical size of the clear aperture of the lens.

A master mask 320 can be patterned to define all of the optical surfaces. A blocking mask 330 can be used to sequentially select non-absorbing openings 340, 350 in the master mask 320 for sequential X-ray beam exposures 360, 370. Alternatively, separate lithographic masks, defining different optical surfaces, can be exchanged between the sequential X-ray exposures, but with a greater likelihood of accrued misalignment of the optical surfaces.

The master mask 320, patterned with a first opening 340 to code a first photoresist latent profile 380 that defines a first cylindrical refractive surface, is positioned over the photoresist layer 310. The second opening 350 in the master mask 320 is blocked by the blocking mask 330. The photoresist layer 310 is exposed, through the master mask 320, to a first collimated X-ray beam 360 tilted at 45° relative to the substrate normal N.

After repositioning the blocking mask 330 over the first opening 340, a second exposure of the photoresist layer 310 through the second opening 350 in the master mask 320 to a second collimated X-ray beam 370, oriented perpendicular to the first X-ray beam 360 and at 45° relative to the substrate normal N, is repeated. The second exposure codes a second photoresist latent profile (not shown) that defines a second, opposing crossed cylindrical refractive surface.

A developer is subsequently applied which, in the case of a positive photoresist, removes the exposed region, producing a crossed-cylindrical lens of developed photoresist having a first cylindrical refractive surface and a second, opposing crossed cylindrical refractive surface. Other variants and modifications of the lithographic process, comprising both positive and negative photoresists, will be apparent to those of skill in the art.

Microoptical systems with microoptical elements made of optical materials other than photoresist can be fabricated using a mold defined by the structure formed in the developed photoresist layer. The developed photoresist is used either directly as a mold or as a sacrificial mandrel for fabrication of a metal or ceramic mold for casting of a desired optical material, such as glass or injection molded polymer. The mold is then removed to leave a microoptical system made of the desired optical material. This extension applies some aspects of the LIGA process, where LIGA is an acronym from the German words for lithography, electoplating, and molding.

When used as a sacrificial mandrel, the developed photoresist can be coated with a thin conducting layer as a precursor plating base onto which a thick layer of mold material is electroplated. The thin conducting layer can be 100 angstroms of chromium followed by 1000 angstroms of copper, deposited by thermal evaporation in vacuum or other thin film deposition technique. A suitable mold material, such as nickel, is then electrodeposited onto the precursor plating base to form a conformal coating on the developed photoresist. The developed photoresist is then stripped from the electrodeposit by ashing in oxygen plasma or dissolution in a suitable solvent, to form a metal mold. The desired optical material, such as glass or polymer, can be introduced in the metal mold by melting, injection molding, a sol-gel process, or other suitable process. The metal mold is then removed by dissolution in acid or other stripping solution to leave a microoptical system of the optical material.

Despite the reasonable optical quality of the basic crossed-cylindrical lens systems, residual aberrations can limit a wide range of potential applications. The image quality can often be improved if the curved refractive surfaces deviate from the basic cylindrical profile.

For such an approximate cylinder with axis parallel to X and perpendicular to Y, the lateral deviation of the surface from a XY plane perpendicular to the optical axis Z is of the form $\Delta z = C_{1y}^2 + C_{2y}^4 + C_{3y}^6 + C_{4y}^8 +$. By adjusting the shape defined by this equation using the additional non-cylindrical degrees of freedom, the image quality of a cylindrical lens can be optimized. Conventional methods to simulate and analyze the performance of an optical element or system can be used in such optimization.

Referring now to FIG. 1, the in-line optical microspectrometer 100 can be have a single optical axis, because the dispersive element is a grism 145 with an undeviated central wavelength. Therefore, the latent profiles of all of the microoptical elements for both the foreoptics section 120 and the spectrometer section 140 can be patterned with only two perpendicular DXRL exposures. The positive lenses can be formed by patterning crossed-cylindrical convex surfaces with perpendicular exposures, one with axis parallel to X and one with axis parallel to Y. Similarly, the slit 130 can be formed by patterning two overlapping, concave surfaces (e.g., two V grooves) in one exposure parallel to the Y axis. As described above, residual aberrations can be corrected and the image quality improved if the curved refractive surfaces deviate slightly from the basic cylindrical profile. The grating surface of the grism 145 can be patterned with one exposure parallel to the Y axis. Fixtures to hold the detector 150 and other optical devices in precise alignment with the optical axis Z can be formed by the same lithographic process as the lenses. Additional perpendicular exposures (e.g., one perpendicular to and one parallel to the surface of the substrate 160) can further correct monochromatic aberrations and provide improved image quality, at the expensive of fabrication complexity. Also, combining optical materials having different dispersive powers can be used to correct chromatic aberrations.

The microspectrometer optical elements can thereby be monolithically formed on the substrate 160 and aligned on the optical axis Z to an accuracy of about one micron. The spacing and tilt angles can be accurate to the same tolerance. The synchrotron X-ray beam can be collimated to better than 0.1 milliradian, so a 0.4-mm aperture optic can be accurate to about 40 nm over its height.

The optical microspectrometer 100 can provide multi-color fluorescent imaging of, for example, a dye-tagged microchip that is illuminated from the back with an excitation laser. The exemplary optical microspectrometer 100 can record up to about 25 different colors across the wavelength band (650 to 1,050 nm). This allows users to spectrally discriminate up to a half a dozen different well-chosen dyes. A single optical microspectrometer 100 can be used for parallel scanning of the microchip. Alternatively, rows of these optical microspectrometers 100 can be interleaved to provide a continuous scan that is many millimeters long. For example, two rows of 100 parallel optical microspectrometers 100 can be arranged to provide simultaneous readout of a microscope-sized microchip in a single pass. This arrangement can provide rapid microarray analysis, high reliability, and operational simplicity by eliminating the need for point-to-point scanning, expensive high-precision optics, and moving optomechanical parts.

It will be understood that the above description is merely illustrative of the applications of the principles of the present invention, the scope of which is to be determined by the claims viewed in light of the specification. Other variants and modifications of the invention will be apparent to those of skill in the art.

We claim:
1. An optical microspectrometer, comprising:
   a substrate having a surface with a plurality of microoptical elements monolithically formed thereon and aligned on an optical axis and wherein the optical surfaces of the plurality of microoptical elements comprise at least one cylindrical surface, the plurality of microoptical elements comprising;
   a slit through which light from an object passes;
   a collimating lens to collimate the light from the slit;
   a grism to spectrally disperse the collimated light from the collimating lens; and
   an imaging lens to focus the light from the grism to provide a spectrally dispersed image of the slit on a detector.

2. The optical microspectrometer of claim 1, the plurality of microoptical elements further comprising:

a collecting lens to collect the light from the object, and a focusing lens to focus the collected light from the collecting lens onto the slit.

3. The optical microspectrometer of claim 1, wherein the grism transmits light of a central wavelength on a path that is parallel to the optical axis of the collimated light beam.

4. The optical microspectrometer of claim 1, wherein the grism is a right angle grism.

5. The optical microspectrometer of claim 1, wherein the grism comprises a diffraction grating surface having a grating frequency that increases monotonically from the grism apex to correct for chromatic aberrations.

6. The optical microspectrometer of claim 1, wherein the plurality of microoptical elements is defined lithographically.

7. The optical microspectrometer of claim 1, wherein the optical surfaces comprise at least one crossed-cylindrical surface.

8. The optical microspectrometer of claim 1, wherein the at least one cylindrical surface deviates from a basic cylindrical profile to correct for residual optical aberrations.

9. The optical microspectrometer of claim 1, wherein the microoptical elements have a clear aperture of less than one millimeter.

10. The optical microspectrometer of claim 1, wherein the overall length of the optical microspectrometer along the optical axis is less than one centimeter.

11. The optical microspectrometer of claim 1, wherein the optical material of the microoptical elements comprises at least one polymer.

12. The optical microspectrometer of claim 11, wherein the at least one polymer comprises polymethymethacrylate, epoxy-based, or a polyamide-based photoresist.

13. The optical microspectrometer of claim 1, wherein the optical material of the microoptical elements comprises a glass.

* * * * *